United States Patent [19]

Fike, Jr.

[11] 4,067,154
[45] Jan. 10, 1978

[54] INSTANTANEOUS VENTING, NON-FRANGIBLE BURST PANEL STRUCTURE

[75] Inventor: Lester Lyman Fike, Jr., Blue Springs, Mo.

[73] Assignee: Fike Metal Products Corporation, Blue Springs, Mo.

[21] Appl. No.: 702,240

[22] Filed: July 2, 1976

Related U.S. Application Data

[63] Continuation-in-part of Ser. No. 551,339, Feb. 20, 1975, abandoned.

[51] Int. Cl.$^2$ .............................................. E04C 2/26
[52] U.S. Cl. ......................................... 52/99; 52/208; 52/232; 52/622
[58] Field of Search ....................... 52/232, 1, 98, 208, 52/455, 631, 105, 622, 623, 629, 99; 49/141; 428/195, 156, 103, 172, 134

[56] References Cited

U.S. PATENT DOCUMENTS

| | | | |
|---|---|---|---|
| 1,304,083 | 5/1919 | Moore | 428/195 X |
| 1,707,026 | 3/1929 | Schuster | 52/98 |
| 2,281,185 | 4/1942 | Forster | 52/623 |
| 2,358,143 | 9/1944 | Castor | 52/1 X |
| 2,537,804 | 1/1951 | Watkins | 52/208 X |
| 2,576,392 | 11/1951 | Downes | 52/208 |
| 2,602,970 | 7/1952 | Gouge | 52/1 |
| 2,659,686 | 11/1953 | Watkins | 52/208 |
| 2,679,467 | 5/1954 | Sherts | 52/98 |
| 2,717,709 | 9/1955 | Squires | 53/629 X |
| 2,721,157 | 10/1955 | Martin et al. | 52/573 X |
| 2,989,787 | 6/1961 | Smith | 52/1 X |
| 3,150,749 | 9/1964 | Robrecht et al. | 52/1 |
| 3,364,088 | 1/1968 | Seman et al. | 52/314 |
| 3,392,489 | 7/1968 | Johnson et al. | 49/141 X |
| 3,649,443 | 3/1972 | Domicone | 52/208 X |
| 3,700,537 | 10/1972 | Scher | 428/172 X |
| 3,764,178 | 10/1973 | Krings et al. | 52/208 X |

FOREIGN PATENT DOCUMENTS 1,464,864   11/1966   France .................................. 52/622

Primary Examiner—Leslie Braun
Attorney, Agent, or Firm—Schmidt, Johnson, Hovey & Williams

[57] ABSTRACT

A flexible, low-mass, non-fragmenting burst member or panel is provided which is extremely predictable and essentially instantaneous in operation, even at low burst pressures, in order to safely vent and protect pressure vessels such as bag houses or the like from the potentially catastrophic effects of internal explosions or adverse high-pressure conditions. The panel structure preferably includes a thin metallic substrate having a pattern of tape directly applied thereto, with a coating of epoxy paint over the tape pattern and substrate; sharp-breaking, shear burst lines are thereby produced along the edges of the tape pattern which ensures that the panel will instantaneously vent a pressure vessel through essentially the entire area of full vent opening, thus giving a degree of operational predictability impossible to attain with conventional burst-type venting structures. The panels thereof can be simply produced in any desired size and shape by applying a tape pattern to a metal substrate of known thickness, followed by spray-coating the substrate and tape to enhance the corrosion and abrasion resistance thereof. Circumscribing frame structure is preferably employed for holding the panel in place, and this, along with the low mass of the panel, prevents creation of dangerous flying fragments when the panel bursts to vent an explosion.

12 Claims, 8 Drawing Figures

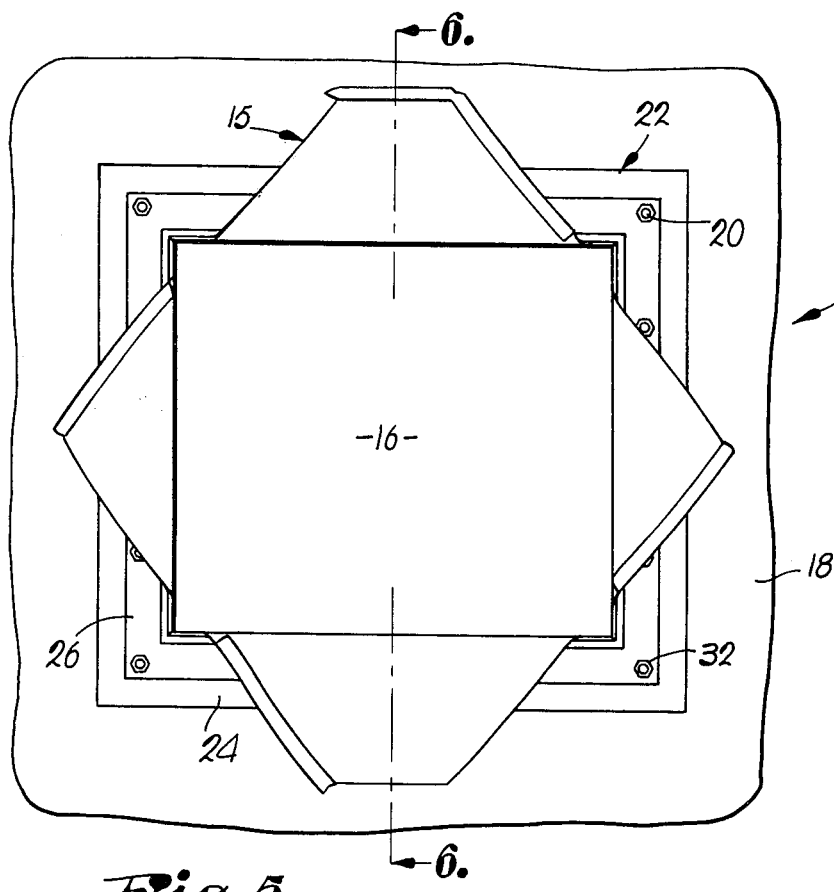
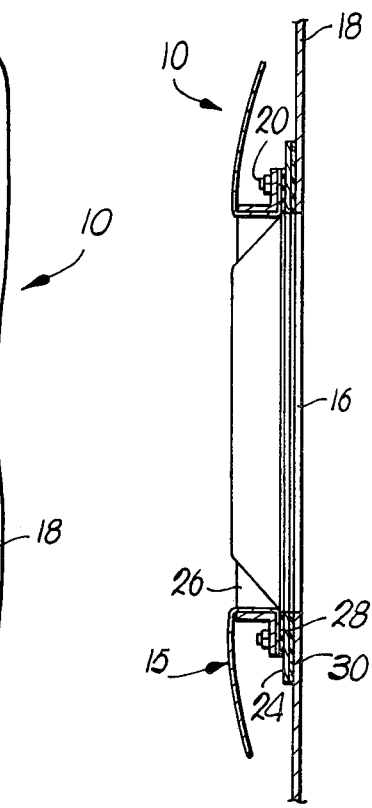
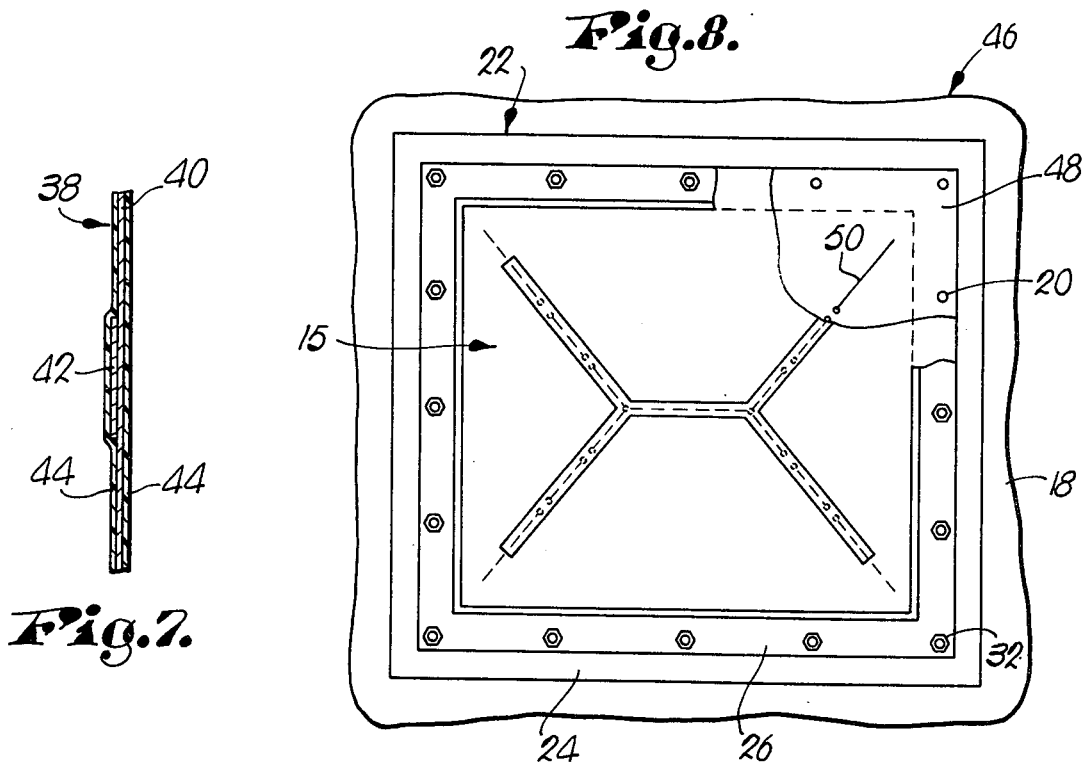

INSTANTANEOUS VENTING, NON-FRANGIBLE BURST PANEL STRUCTURE

This is a continuation-in-part of application Ser. No. 551,339, filed Feb. 20, 1975, and entitled "LAMINATED FRANGIBLE PANEL AND METHOD OF PRODUCING SAME," now abandoned.

This invention relates to a simplified, flexible, non-fragmenting burst panel especially adapted to protect pressure vessels from the effects of internal explosions by essentially instantaneously venting the explosion in a manner to preclude catastrophic buildup of pressures within the vessel. More particularly, it is concerned with a flexible, low-mass burst panel which provides extremely predictable, low pressure operation, and which can be easily produced in essentially any desired size and shape without the necessity of scoring or other sophisticated fabrication techniques. The panel preferably includes a thin, flexible metallic substrate having a pattern of tape directly applied thereto and with a synthetic resin coating over the tape and substrate, in order to define sharp-breaking, shear burst lines in the panel capable of instantaneously bursting to expose the entire vent opening to thus completely vent a pressure vessel such as a mill bag house or the like in the shortest time and in the most predictable manner.

Burst membranes or panels have been in use for many years for affording a degree of protection to chambers or the like subject to the buildup of dangerously high internal pressures. Generally, such protective devices are designed to rupture at a predetermined internal pressure in order to vent the chamber and prevent the buildup of pressures therein to an extent which could completely explode and destroy the chamber.

Protective burst members are oftentimes used in conjunction with dust collecting equipment, such as cyclone-type separators or so-called bag houses. Such dust collection equipment is conventionally employed to collect mill dust, as an adjunct to foundry operations, and in a wide variety of other industrial applications where dust is a potential problem. In this connection, there has recently been a tremendous increase in the use of dust collection equipment by virtue of newly promulgated government regulations regarding permissible emissions of dust and the like into the atmosphere. In fact, such equipment is today found in many plants where only a few years ago dust and particulate matter were simply discharged without any dust collection whatsoever.

Of course, the increase in the use of bag houses and other dust collection equipment has correspondingly increased the risk of explosion inherent in dust collection. In this regard, an average of two dust-related industrial explosions are at present being reported every week in the United States, while as little as 5 years ago two such explosions per year would be considered normal. As can be appreciated, this rise in the number of explosions attributable to dust collection has made it extremely important that all dust collecting devices be equipped with means for adequately handling the explosion problem. This is particularly important in view of the potentially catastrophic results which can follow dust explosions, both in terms of property damage and injury or even death to nearby workers.

Moreover, the need for explosion protection with modern-day collection equipment is even more acute than is the case with older equipment, since newer bag houses and the like have tended to be less rigidly constructed and able to withstand internal explosions than older units. This latter factor also points up the fact that burst members for newer equipment must rupture at lower pressures than heretofore necessary, in order to vent internal explosions before excessive pressure buildup occurs.

A number of expedients are being resorted to at present in an attempt to provide adequate venting for modern-day dust collection equipment. Essentially all of this equipment is provided with vent openings which are normally covered by a burstable membrane or panel. For example, many bag houses and the like use materials such as roofing paper, cloth, plastic and metal foils as a burst membrane. These may be scored or otherwise configured to present lines of weakness, and are supposed to rupture at a given internal pressure level.

In practice, however, use of such conventional burst membranes has proven less than satisfactory. Perhaps the chief objection to these expedients stems from their lack of predictability in operation. That is, while the simple burst pressure of some conventional membranes may be estimated with some degree of accuracy, the burst pattern thereof is essentially random. This means that it is difficult or impossible to calculate the degree of actual venting achievable with a given membrane. For example, a simple metal foil membrane may in one instance quickly open and permit adequate venting, while in another case it may only partially open and thus present a substantial restriction to venting. Under these circumstances, it is very difficult to determine the number and size of vents to be provided for a given dust collection device.

The above problem is accentuated by virtue of the fact that most burst membranes do not rupture at relatively low pressures and do not operate on an essentially instantaneous basis. This can be extremely troublesome when it is considered that a pressure increase of from 20,000 to 60,000 psi per second can be generated in an explosion of metal dust. Under these circumstnces, any delay in venting stemming from failure to burst or incomplete opening can wholly negate the purpose of providing burst members; that is, unless venting is essentially instantaneous, the pressure rise within the dust collection equipment can completely explode the latter while leaving the supposedly protective burst membranes in place.

Another objection to conventional burst members stems from the fact that they can create, upon rupturing, extemely dangerous projectiles in the form of panel fragments. The very high pressures resulting from dust explosions not only will rupture the burst panels, but if special measures are not taken, the fragments resulting from panel rupture can become more dangerous than the explosion itself. This is particularly true with respect to burst members made of relatively heavy materials; these units can create a significant fragmentation problem and be extremely dangerous to nearby personnel.

One type of pressure-responsive blowout device is disclosed in U.S. Pat. No. 2,679,467 to Sherts. This unit employs a pair of segmented or scored glass sheets having a flexible synthetic resin interlayer therebetween. In the event of an explosion, the laminated construction is forced outwardly for venting purposes. The chief objection to a blowout unit of this type stems from the rigid, relatively high-mass construction employed. This would very probably slow the requisite venting time of the unit down to the point where it would not be usable for venting dust explosions. Moreover, the use of glass as a reinforcing medium for the device could be extremely dangerous and produce flying shards in the event of a high-pressure explosion.

It is therefore the most important object of the present invention to provide a flexible, low-mass, non-fragmenting burst membrane or panel which gives predictable, essentially instantaneous operation even at low burst pressures in order to safely vent and protect pressure vessels or chambers such as bag houses or other dust collecting equipment from the effects of internal explosions caused by the buildup of dust.

Another aim of the invention is to provide a burst membrane of the type described which can be easily and quickly fabricated in essentially any desired size and shape and preferably includes a thin metallic substrate having a pattern of flexible webbing or tape directly applied thereto, with a coating of synthetic resin paint over the tape and substrate, in order to define sharp-breaking, shear burst lines along the edges of the tape pattern which ensures that the panel will instantaneously rupture and substantially completely open along the burst pattern lines so that the entire area of the vent opening is quickly exposed to the atmosphere; this gives a high degree of predictability to the burst panel's operation and makes it possible to accurately calculate the required venting area for a given piece of dust collecting equipment to be protected.

Another object of the invention is to provide a low-mass burst member or panel which can be constructed from a substrate of known thickness so that the member will burst at a predetermined internal pressure; in this regard, the thickness of the substrate is preferably up to about 1/16 in., with a most preferred thickness of from about 0.001 to 0.025 in., so that the member is of sufficiently low mass to instantaneously flex outwardly in response to a buildup of pressures within the protected chamber or vessel and thereby achieve complete venting through the full area of the vent opening.

In the drawings:

FIG. 5 is an elevational view similar to that of FIGS. 1 and 3 which illustrates the full venting position of the burst panel portions after rupturing of the latter;

FIG. 6 is a vertical sectional view along line 6—6 of FIG. 5 and further depicting the full-open actuation position of the burst panel portions;

FIG. 7 is a vertical sectional view of another embodiment of the burst panel having a tape pattern only on one face of the flexible metal substrate; and FIG. 8 is a front elevational view of a burst panel construction with parts broken away for clarity, and wherein a cancavo-convex, burstable vacuum support is provided in backing relationship to the burst panel.

Figure 1:
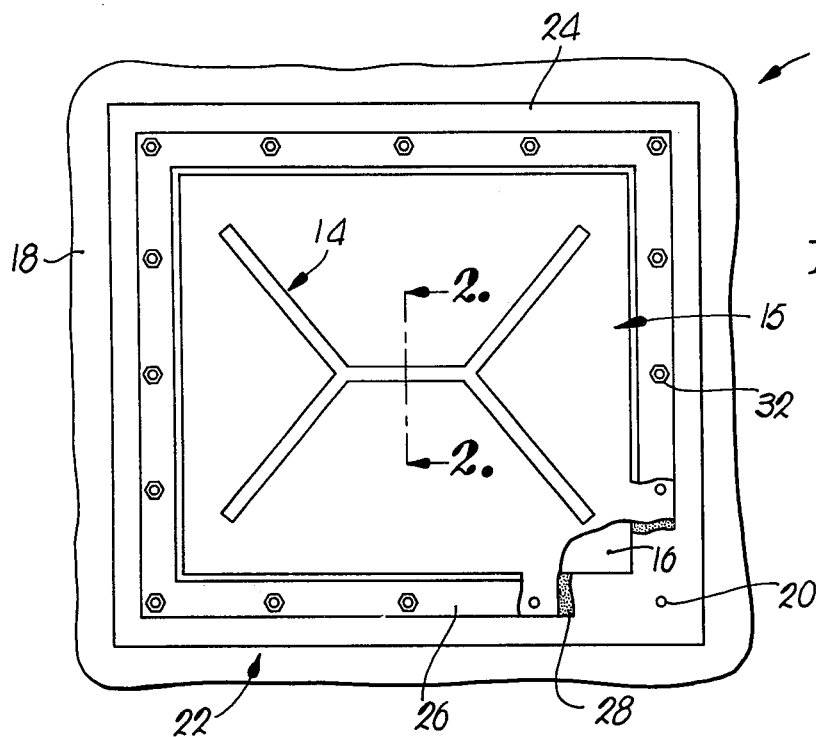
FIG. 1 is a front elevational view with parts broken away for clarity of a burst membrane or panel in accordance with the invention mounted within circumscribing frame structure situated in the wall of a chamber or the like subject to the buildup of dangerously high internal pressures.

Referring now to FIG. 1, a burst member 10 broadly includes a thin, flexible substrate sheet 12 formed of a frangible material, along with nonrigid means broadly referred to by the numeral 14 for defining a sharp-breaking, predetermined burst pattern for sheet 12. The latter and means 14 present a burstable membrane or panel 15, which in most instances is rectangular in shape for ease of manufacture and installation. As will be explained in more detail hereinafter, the thickness of sheet 12, and pattern-defining means 14, are cooperable for assuring substantially instantaneous bursting of panel 15 along the pattern, with substantially instaneous outward movement of the bursted portions of the panel.

Figure 4:
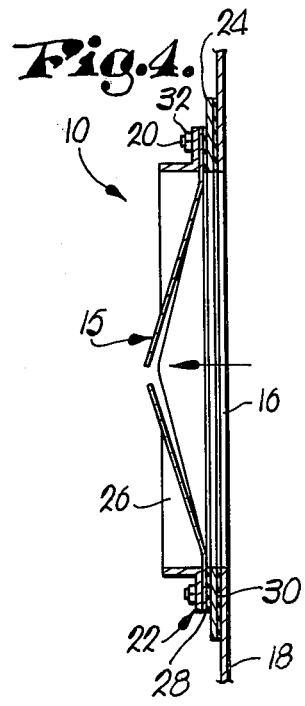
FIG. 4 is a vertical sectional view along line 4—4 of FIG. 3 and further depicting the initial bursting of the panel.

In more detail, member 10 is mounted in normally covering and closing disposition to a vent opening 16 provided as an adjunct to a chamber 18 such as a dust-collecting bag house or the like subject to buildup of dangerously high internal pressures. The defining wall of opening 16 has a plurality of circumferentially spaced, upstanding threaded bolts 20 around the periphery of the opening for receiving and securing marginal frame structure 22 provided with member 10. Structure 22 includes a marginally apertured rectangular frame member 24 adapted to be positioned over the bolts 20, in conjunction with a rectangular, generally cross-sectionally L-shaped bracket member 26, which is similarly apertured and adapted to be slipped over the bolts 20. A flexible gasket 28 is interposed between members 24 and 26 and engages the marginal edge of panel 15 as best seen in FIGS. 1 and 4. In addition, a flexible gasket 30 is provided between the underside of frame member 24 and the adjacent portions of the wall of chamber 18. A plurality of nuts 32 are provided for pulling the entire frame assembly 22 into tight engagement for holding panel 15 in place.

Substrate 12 is preferably formed of a flexible, shape-retaining metallic material such as aluminum, carbon or stainless steel, tin, titanium, lead, nickel, silver or platinum. However, other types of flexible materials could also be used. In most cases, though, aluminum has been found to give the best combination of rupture characteristics and handling properties. For most applications substrate 12 should have a thickness of up to about 1/16 in., and most preferably from about 0.001 to 0.025 in. This gives adequate flexibility and desirable low burst strength.

Figure 2:
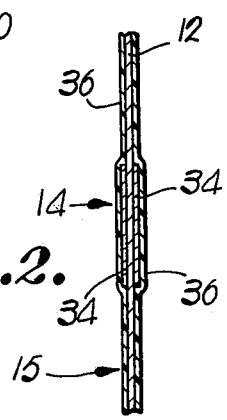
FIG. 2 is a vertical sectional view along line 2—2 of FIG. 1 and illustrating the construction of the burst panel.

Pattern-defining means 14 is provided on at least one face of substrate sheet 12 and is flexible with the latter. In preferred forms, means 14 includes at least one relatively narrow web of flexible material such as masking tape 34 (see FIG. 2) adhered directly to the substrate. In the case of the FIG. 2 embodiment, tape is applied in a predetermined pattern to the opposed faces of substrate 12, with the pattern on each face of the latter being substantially identical and in register with the pattern on the opposed face.

Although any one of a number of tape patterns could be applied to substrate 12 to good effect, the preferred pattern includes an elongated, generally centrally disposed strip, with two pairs of diverging strips applied to the face, with each pair thereof leading from a respective end of the centrally disposed strip towards the adjacent corners of the substrate. In order to facilitate low-pressure actuation of panel 15 along the central tape strip, the latter is preferably positioned generally along and in alignment with the grain structure of metal substrate 12. This grain structure is caused during roll-milling of the substrate. The particular pattern described above is best illustrated in FIG. 1. In practice, this type of pattern has proven to give very advantageous rupture characteristics for ensuring essentially instantaneous and complete opening of panel 15.

Means 14 also preferably includes a synthetic resin coating applied over the face of substrate sheet 12 bearing the tape strips 34, and preferably over both faces of the sheet. In preferred forms, a coating 36 of epoxy paint is electrostatically applied over both faces of substrate sheet 12, and over the tape strips 34. However, other coatings such as Teflon, vinyls and other synthetic resins could also be used as long as such coatings do not interfere with the operation of panel 15 and give an adequate degree of corrosion and abrasion resistance to the latter.

Figure 3:
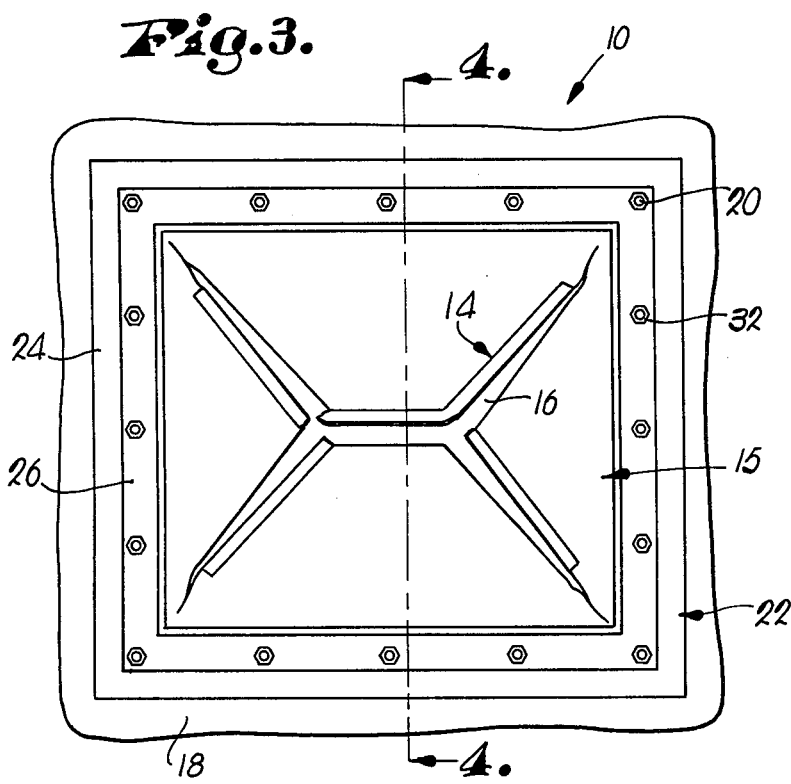
FIG. 3 is an elevational view similar to that of FIG. 1 but showing the burst panel during the initial stages of rupturing along the sharp-breaking burst lines thereof.

The operation of member 10, and specifically panel 15, can best be seen from a study of FIGS. 3-6. Referring first to FIGS. 3 and 4, a buildup of pressure within chamber 18 to a predetermined magnitude will cause an initial rupture of substrate 12 along the edges of tape strips 34. In this connection, it is believed that the combination of tape strips 34 and synthetic resin coating 36 in effect serves to concentrate the pressure forces exerted against panel 15 along the edges of the tape strips. This in turn creates shear burst lines for panel 15 which ensures entirely predictable, essentially instantaneous operation thereof at relatively low pressures. In fact, it has been determined that an unmodified aluminum 18 inch × 35 inch rectangular substrate sheet having a normal burst pressure of approximately 4 psi above atmospheric will, when employed in conjunction with tape strips 34 and the epoxy paint coating, burst at approximately 1.2 to 1.4 psi above atmospheric. Thus, provision of burst pattern-defining means 14 in effect lowers the rupture pressure of the substrate and renders the same instantaneously actuatable.

Referring now to FIGS. 5 and 6, the full-open position of the bursted portions of panel 15 is illustrated. In effect, each of the bursted portions of the panel is "folded back" against the circumscribing frame structure so that essentially the entire vent opening 16 is open to the atmosphere. This in turn ensures that adequate full venting occurs through opening 16, and that no restriction is presented to venting during the critical period at the start of an internal explosion within chamber 18 when the rate of pressure rise is lowest. Testing with a burst member of the type depicted has demonstrated that a period of only approximately 1/1200 of a second elapses between initial rupturing of the panel and the full-open venting position thereof illustrated in FIGS. 5-6; accordingly, it will be appreciated that operation of panel 15 is essentially instantaneous and is therefore operable to vent and safely relieve an internal explosion within chamber 18.

In addition to the foregoing, the low mass of substrate 12, in conjunction with circumscribing frame structure 22, prevents the bursted portions of panel 15 from fragmenting and becoming dangerous projectiles. The non-fragmenting nature of panel 15 is illustrated in FIGS. 5-6 where the flexible, coated substrate 12 is folded back to expose opening 16. As explained above, fragmentation is a prime drawback of many conventional burst members, but the present invention solves this problem; furthermore, in the unlikely event that portions of panel 15 break free during rupture, the low mass of the panel drastically reduces the chances of serious property damage or injury to nearby workers.

Panel 15 is simply constructed by directly applying the tape strips 34 to substrate 12 in a desired pattern, whereupon epoxy coating in dry, granular form is electrostatically applied over the substrate and tape pattern and oven-dried to fuse the paint to the substrate. Both sides of substrate 12 are preferably coated to enhance corrosion and abrasion resistance, but this is not absolutely necessary. In addition, although in many cases an identical, registered tape pattern will be applied to the opposed faces of substrate 12, tape can be applied only to one face thereof. This particular embodiment is depicted in FIG. 7, wherein a burst panel 38 is provided and includes an aluminum substrate 40, a pattern of tape 42 on one face thereof and a protective coating 44 over both faces of the substrate.

Another embodiment of the invention is illustrated in FIG. 8. In particular, a burst member 46 is provided in covering disposition to a vent opening provided in chamber 18, along with a concavo-convex, slotted burstable vacuum support 48 in backing relationship to burst panel 15. Member 46 includes a panel 15 and frame structure 22, as in the case of the first-described embodiment. Frame structure 22 holds the marginal edges of panel 15 and vacuum support 48. In this regard, panel 15 is in this instance pre-bulged to conform to the shape of support 48.

The purpose of vacuum support 48 is to prevent inward buckling or cycling of panel 15 in the event that chamber 18 experiences a negative pressure. As can be appreciated, such buckling or cycling is undesirable in that panel 15 can tend to become creased or weakened thereby.

The operation of burst member 46 is essentially identical with that described in connection with burst member 10. That is, panel 15, along with vacuum support 48, are constructed for essentially instantaneous outward opening in the event of an explosion within chamber 18 in order to give full and essentially instantaneous venting. In this connection, vacuum support 48 is of conventional construction and includes a metallic sheet having openings or slits 50 therein which communicate the rearward face of panel 15 with the interior of chamber 18. As illustrated, the pattern of slits 50 is identical with the burst pattern of panel 15, so that low-pressure bursting is assured.

In situations in which relatively high negative pressures are experienced, a tape pattern on the panel substrate extending around three sides thereof is preferred. Of course, the slit pattern on the vacuum support would be similarly configured for registration with the tape pattern. Opening of this type of burst member would be analogous to the opening of a lid, with the panel and vacuum support being folded back along the unweakened edges thereof.

Having thus described the invention, what is claimed as new and desired to be secured by Letters Patent is:

1. A frangible burst membrane or panel adapted to be mounted in normally covering and closing disposition to a vent opening provided with a chamber or area to be protected subject to the buildup of dangerously high internal pressure said membrane comprising:

a thin, flexible substrate sheet formed of a frangible metallic material capable of bursting at relatively low pressures;

elongated, nonrigid flexible, pattern-defining means on at least one face of said sheet and flexible with the latter extending across a significant part of the sheet, at least one edge of said pattern-defining means presenting a sharp-breaking, predetermined burst pattern for the sheet; and a non-metallic, flexible, relatively thin coating of abrasion and corrosion resistant material on said sheet, said burst pattern-defining means being configured and arranged and cooperable with said coating to cause the membrane to burst at a lower pressure than the burst pressure of the sheet and assuring substantially instantaneous bursting of said sheet along said pattern when the pressure within said chamber or the like reaches a relatively low predetermined magnitude, and for substantially instantaneous essentially non-fragmenting outward movement of the bursted portions of the sheet for venting of said chamber or the like through substantially the entirety of said vent opening.

2. The burst membrane or panel of claim 1 wherein said burst pattern-defining means includes at least one relatively narrow web of flexible tape adhered directly to at least one face of the substrate with said coating overlying and covering both the tape and said sheet.

3. The burst membrane or panel of claim 1 wherein said coating material is a synthetic resin composition applied over said web and at least one face of the sheet.

4. The burst membrane or panel of claim 1 wherein said burst pattern-defining means includes a plurality of elongated webs applied in a predetermined pattern to the opposed faces of said sheet, the pattern on each sheet face being substantially identical and in register with the pattern on the opposed sheet face.

5. The burst membrane or panel of claim 4 wherein said coating material is a synthetic resin applied over said web patterns and opposed faces of said sheet.

6. The burst membrane or panel of claim 1 wherein the thickness of said sheet is up to about 1/16 in.

7. The burst membrane or panel of claim 6 wherein said thickness is from about 0.001 to 0.025 in.

8. The burst membrane or panel of claim 1 including clamping means for holding the marginal edges of said burst membrane and preventing said bursted portions from breaking free upon bursting of said sheet.

9. The burst membrane or panel of claim 1 including a concavo-convex, burstable vacuum support in backing relationship to said sheet for preventing the latter from being pulled inwardly in the event of negative pressure conditions within said chamber or the like.

10. The burst membrane or panel of claim 1 wherein said sheet is generally rectangular in configuration.

11. The burst membrane or panel of claim 10 wherein said burst pattern-defining means includes:
a first, elongated, generally centrally disposed strip of tape applied to one face of said sheet; and
two pairs of diverging strips of tape applied to said one face with each pair thereof leading from a respective end of said centrally disposed strip towards the adjacent corners of said sheet.

12. The burst membrane or panel of claim 11 including a coating of oven-dried epoxy paint applied over said one face and all of said tape strips.

* * * * *